(12) United States Patent
Oh et al.

(10) Patent No.: US 9,416,778 B2
(45) Date of Patent: Aug. 16, 2016

(54) SELF-GETTERING DIFFERENTIAL PUMP

(75) Inventors: Seongshik Oh, Piscataway, NJ (US);
Yong-Seung Kim, Seoul (KR)

(73) Assignee: RUTGERS, THE STATE UNIVERSITY OF NEW JERSEY, New Brunswick, NJ (US)

(*) Notice: Subject to any disclaimer, the term of this patent is extended or adjusted under 35 U.S.C. 154(b) by 904 days.

(21) Appl. No.: 13/448,316

(22) Filed: Apr. 16, 2012

(65) Prior Publication Data

US 2013/0087095 A1    Apr. 11, 2013

Related U.S. Application Data

(60) Provisional application No. 61/475,782, filed on Apr. 15, 2011.

(51) Int. Cl.
| | |
|---|---|
| *C30B 23/06* | (2006.01) |
| *F04B 37/02* | (2006.01) |
| *C30B 25/08* | (2006.01) |
| *C30B 23/02* | (2006.01) |

(52) U.S. Cl.
CPC ............... *F04B 37/02* (2013.01); *C30B 23/02* (2013.01); *C30B 23/06* (2013.01); *C30B 25/08* (2013.01)

(58) Field of Classification Search
CPC ....................................................... C30B 23/06
See application file for complete search history.

(56) References Cited

U.S. PATENT DOCUMENTS

| | | | | |
|---|---|---|---|---|
| 3,974,002 | A * | 8/1976 | Casey et al. | 438/22 |
| 4,426,237 | A * | 1/1984 | Freeouf et al. | 117/108 |
| 5,007,372 | A * | 4/1991 | Hattori et al. | 118/715 |
| 5,041,719 | A * | 8/1991 | Harris et al. | 219/390 |
| 5,804,046 | A * | 9/1998 | Sawada et al. | 204/298.11 |
| 6,136,165 | A * | 10/2000 | Moslehi | 204/298.06 |
| 6,572,744 | B1 * | 6/2003 | Paranjpe et al. | 204/298.11 |
| 2009/0301390 | A1 * | 12/2009 | Vanhatalo | 117/108 |
| 2010/0206215 | A1 * | 8/2010 | Hosokura | 117/63 |

* cited by examiner

*Primary Examiner* — Robert M Kunemund
(74) *Attorney, Agent, or Firm* — Fox Rothschild LLP (57) ABSTRACT

A self-gettering differential pump for a molecular beam epitaxy system has a collimator with a length greater than its diameter mounted in front of a source in extended port geometry, wherein the reactant delivered by the source also serves as a gettering agent.

9 Claims, 6 Drawing Sheets

SELF-GETTERING DIFFERENTIAL PUMP

CROSS-REFERENCE TO RELATED APPLICATIONS

This application claims the benefit of priority under 35 U.S.C. §119(e) of U.S. Provisional Application Ser. No. 61/475,782, filed on Apr. 15, 2011, the entire disclosure of which is incorporated herein by reference.

STATEMENT REGARDING FEDERALLY SPONSORED RESEARCH OR DEVELOPMENT

The invention was made with government support under Contracts No. NSF DMR-0845464, awarded by the National Science Foundation and ONR N000140910749, awarded by the Office of Naval Research. The government has certain rights in the invention.

FIELD

The embodiments described in this document relate to the field of Molecular Beam Epitaxy (MBE) deposition of films, including single crystal films. One embodiment is a self-gettering differential pump for an MBE system. Another embodiment is a method of reducing flux instability in an MBE system.

BACKGROUND

In complex-oxide molecular beam epitaxy (MBE) processes, multiple source elements with significantly different oxygen affinities are used together. However, the source oxidation of easily oxidized elements leads to flux instability, and maintaining stable fluxes for all elements in an oxygen environment is a challenging task. If all elements used are easily oxidized, such as in the case of Sr(Ca, Ba)TiO$_3$, a low background oxygen pressure, in the $10^{-7}$ Torr range, is sufficient and flux instability is not critical. However, this issue becomes prominent when an easily oxidized element is used together with a difficultly oxidized element, such as Cu in cuprates and Pb in PbTiO$_3$, which require a high pressure (approximately $10^{-5}$ Torr) of background ozone to oxidize the difficultly oxidized elements, Cu and Pb. Theis et. al. showed that while the flux rate for a Ti source remained fairly constant at a background ozone pressure of $2\times10^{-6}$ Torr, it dropped by 2.5% per hour when subjected to an ozone background pressure of $5\times10^{-5}$ Torr. For elements such as Ba, a greater than 50% flux drop has been observed under similar oxidation conditions. In such a harsh oxidation environment, a real-time flux monitoring scheme, such as atomic absorption spectroscopy (AA), has been employed in order to achieve a flux variation of less than 1% for the more easily oxidized elements over several hours of growth. However, such a scheme increases the complexity of the growth process as the number of elements grows, and it is also cumbersome to implement. It has now been discovered that minimizing the oxygen partial pressure near the source surface, even in a harsh oxygen environment, provides a superior solution to the flux instability problem. When the O$_2$ partial pressure near the source surface is kept negligible, the flux has been found to be stable throughout the entire growth cycle, thus eliminating the need for real-time monitoring.

SUMMARY

In an embodiment, a self-gettering differential pump for a molecular beam epitaxy system includes a collimator having a length greater than its diameter. The collimator includes a first end positioned in proximity to a vacuum chamber opening and a second end positioned in proximity to a port. An effusion cell is positioned in the port. When activated, the effusion cell delivers a reactant through the collimator to the opening. The reactant also serves as a gettering agent, and the reactant may be deposited along one or more sidewalls of the collimator. In some embodiments, the reactant source is a multi-element source. The reactant may include, for example, one or more of Sr, Mg, Ca, Ba, Ti and Zn. In some embodiments, the length-to-inner diameter ratio of the collimator is greater than 10. In other embodiments, the ratio is from about 2 to about 7. Other ratios are possible.

In another embodiment, a molecular beam epitaxy system includes a vacuum chamber having an opening and a self-gettering differential pump that is in fluid communication with the opening. The pump includes a collimator having a length greater than its diameter. The collimator includes a first end positioned in proximity to the opening and a second end positioned in proximity to a port. The port contains an effusion cell that, when activated, the effusion cell delivers a reactant through the collimator to the opening. The reactant also serves as a gettering agent. The sidewalls of the collimator may hold, or may be made in whole or in part of, the reactant. In some embodiments, the reactant source is a multi-element source. The reactant may include, for example, one or more of Sr, Mg, Ca, Ba, Ti and Zn. In some embodiments, the length-to-inner diameter ratio of the collimator is greater than 10. In other embodiments, the ratio is from about 2 to about 7. Other ratios are possible.

In another embodiment, a method of reducing flux instability in a molecular beam epitaxy system includes operating a self-gettering differential pump that is in fluid communication with an opening of a vacuum chamber. The pump includes a collimator having a length greater than its diameter. The collimator includes a first end positioned in proximity to the opening and a second end positioned in proximity to a port. The port includes an effusion cell that, when activated, delivers a reactant through the collimator to the opening. The effusion cell also may deposit reactant on one or more sidewalls of the collimator so that the sidewalls serve as an oxygen getter.

DETAILED DESCRIPTION

Figure 1:
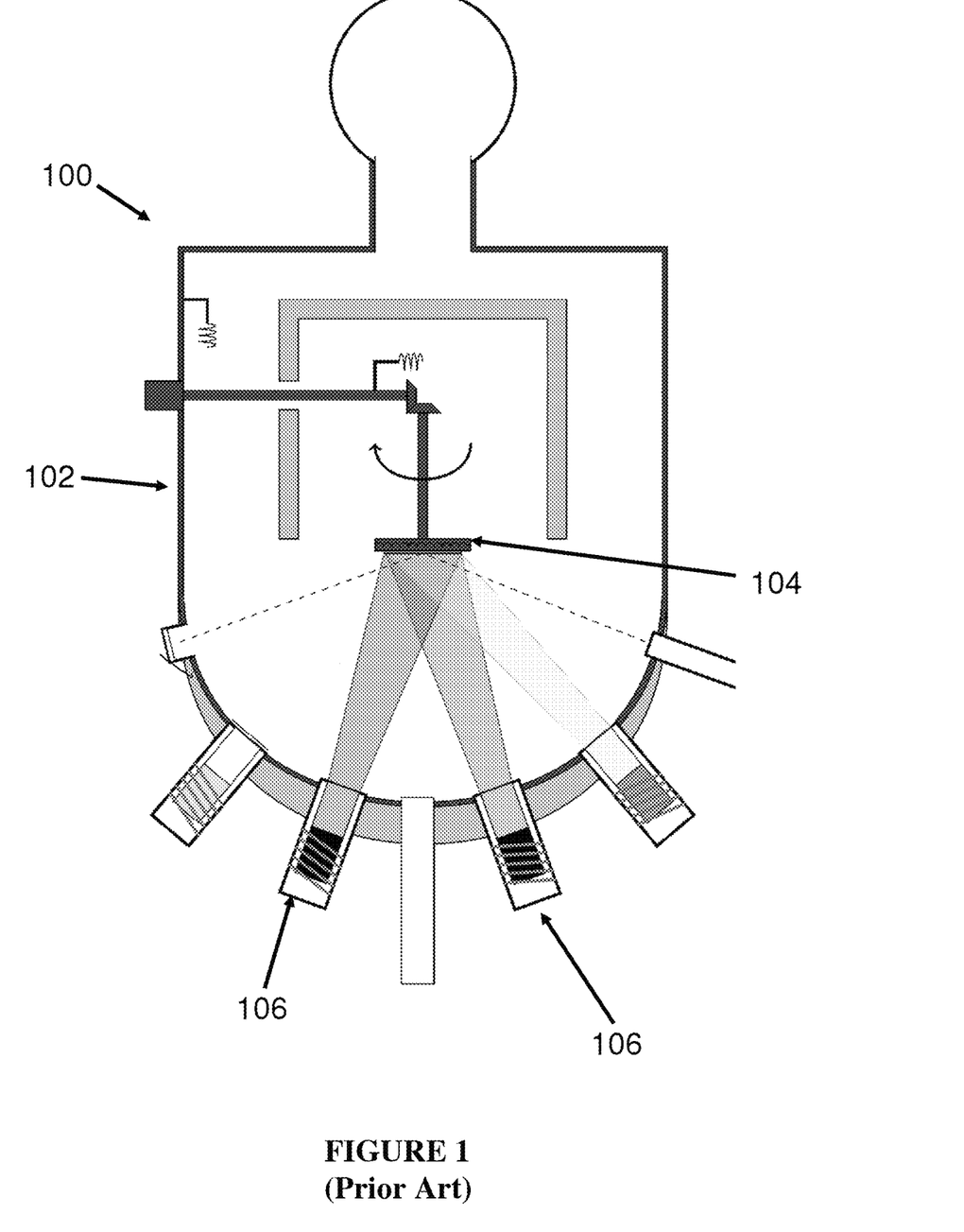
FIG. 1 illustrates an example of a common molecular beam epitaxy system.

FIG. 1 illustrates an example of a typical molecular beam epitaxy (MBE) system 100 that may be used for the formation of microstructures. (Source: Vegar Ottesen, http://commons.wikimedia.org/wiki/File:MBE.png). The system 100 includes a vacuum chamber 102 in which a sample block 104 is positioned. One or more reactant sources, each generally an effusion cell 106 that includes a port through which the cell delivers one or more reactants into the chamber for deposition on a substrate that is positioned on the sample block 104.

Figure 2:
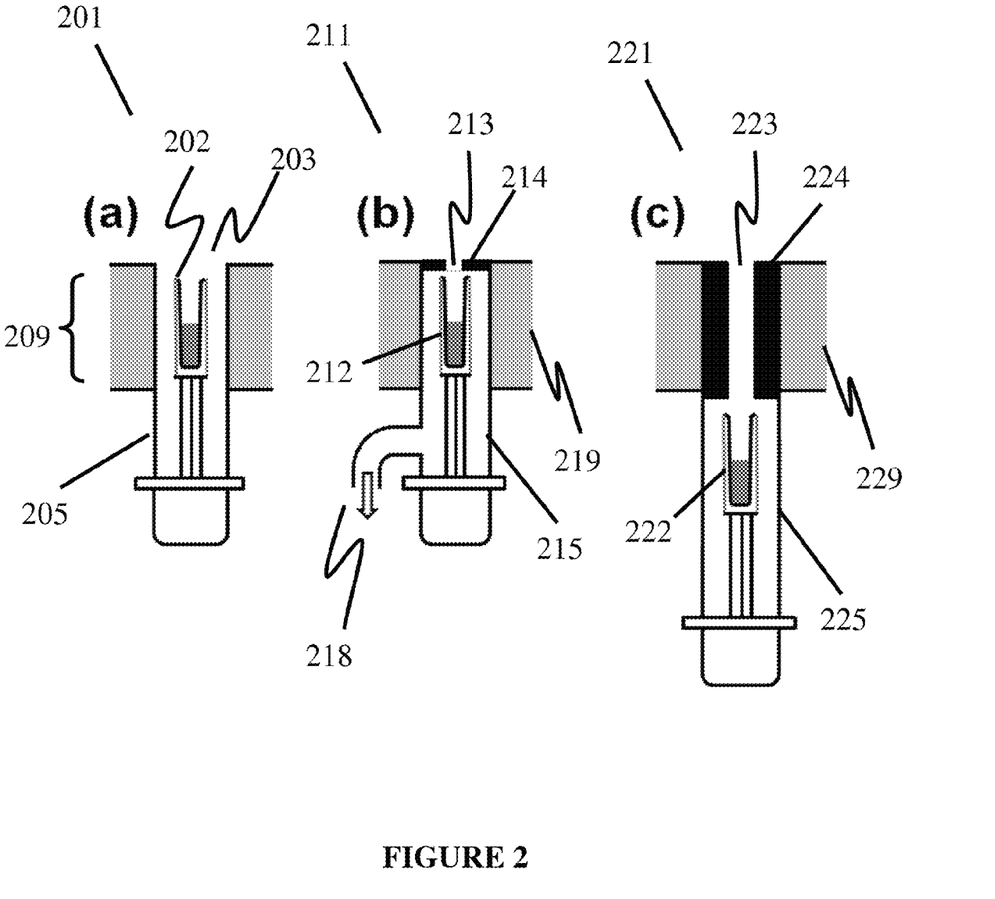
FIG. 2 illustrates cross sections of a standard port for a vacuum chamber, a port with reduced aperture and differential pumping, and an extended port with collimator.

FIG. 2 illustrates several variations of the geometry of the port through which an effusion cell may deliver reactant into the chamber. In a first embodiment, a standard port 201 includes an effusion cell 202 that is positioned within a housing 205. The opening 203 between the housing 205 and the vacuum chamber has a size that equals that of the cross-sectional area of the interior of the port 201. Note that the tip of the effusion cell 202 is positioned within the wall of the vacuum chamber 209, or otherwise near the opening 203 so that there substantially no distance between the opening 203 and the tip of the effusion cell 202.

In a second embodiment 211, the opening 213 is made smaller by a port aperture 214 that is positioned at the end of the housing 215. The port aperture reduces the size of the opening 213 to a width that is smaller than a width of the effusion cell 212. As with the first embodiment, the tip of the effusion cell 212 is positioned near the opening 213 so that there is very little distance between the opening 213 and the tip of the effusion cell 212. The second embodiment also includes a pump port 218 that provides an opening to the port 211 to which a differential pump may be connected. The pump is positioned outside of the vacuum chamber to allow the vacuum to be drawn into the housing 215.

In a third embodiment 221, a collimator 224 extends from the opening 223 to the port 225 for a distance 229. The length (i.e., size from the opening 223 to the opposite end) of the collimator 224 is greater than its width (i.e., inner diameter). Thus, the collimator serves as a spacer between tip of the port 225 and opening 223 so that there is a substantial distance between the opening 223 and the tip of the effusion cell 222. The inner sidewalls of the collimator 224 may serve as a substrate for a layer of reactant so that the sidewalls of the collimator serve as an oxygen getter. The collimator may be made of any suitable ultra high vacuum compatible material, such as stainless steel. In some embodiments, the wall of the vacuum chamber may serve as part of the collimator, and/or the deposited reactant may be deposited on or serve as part of one or more inner sidewalls of the collimator.

The length of the extended port geometry 221 should be just long enough to put the long collimator 224 in front of the source (effusion cell) 222. The extended port's length is determined by the length of the long collimator. A standard port 201 does not have any measurable length in front of the source effusion cell. To be defined as a long collimator, the length of the collimator must be greater than its diameter; thus, the ratio of length to diameter must be greater than one. The larger the ratio, the better the pumping efficiency. However, as the ratio gets larger, the flux uniformity on the substrate where films are deposited tends to degrade. Therefore, the optimum ratio should be determined based on the substrate size and the level of pumping efficiency. If we assume 100% gettering efficiency, our differential pump with length L and inner diameter D is expected to reduce the pressure inside the effusion cell relative to that of the chamber by a factor of $\mathrm{Sqrt}(1+(D/L)^2)/(\mathrm{Sqrt}(1+(D/L)^2)-1)$. This equation provides pressure reduction factor of 10 for L/D=2, 50 for L/D=5 and 100 for L/D=7. In other words, the larger is the L/D ratio, the more effective is the differential pumping. However, an L/D ratio that is too large will be detrimental to the flux uniformity of the element and thus one has to compromise between maximal differential pumping and flux uniformity on the substrate. Although the examples below include a unit having L/D equal to 12.7, a unit having an L/D ratio from about two to about seven, which corresponds to differential pumping ratio of about 10 and about 100, respectively, will be enough for most applications. Other ratios are possible and are included in the scope of this disclosure. In addition to the L/D ratio, in some embodiments it may be desirable to keep D not much larger than the opening of the source crucible in order to continuously coat the inner wall of the collimator by the source element, which works as the gettering medium. The long collimator minimizes the source area exposed to oxygen species as does the crucible aperture, and its long walls act as an effective oxygen getter as does the extended port geometry. Thus, the long collimator embodiment 221 serves as a self-gettering differential pump and uses the source itself, which typically comprises an effusion cell 222 as a pumping medium to reduce or eliminate the source oxidation problem and stabilize the flux even when the flux is as low as approximately 0.01 Å/sec, which is an order of magnitude lower than the typical growth rate.

The source (i.e., effusion cell 222) may be a multi-element source, with elements selected from the group consisting of strontium, magnesium, calcium, barium, titanium and zinc. Most preferably, the source comprises strontium. Alternatively, the source may consist essentially of, or consist only of single elements, such as those indicated above, most preferably strontium.

As an example using the embodiments above, the inventors performed experiments using a custom-designed SVTA MOS-V-2 MBE system with a base pressure of approximately $10^{-10}$ Torr. The source comprised high purity strontium (99.99%) loaded in a pyrolytic boron nitride (PBN) crucible and thermally evaporated from a low-temperature effusion cell (SVTA-275/450/458-XX). The cell temperature was controlled by a Eurotherm 2408 temperature controller and the flux drift was less than 1% over several hours in the absence of oxygen ambient. The partial pressures of oxygen and Argon were controlled by a differentially-pumped mass flow controller (MFC) in combination with a precision leak valve. Sr was used as a test source, and the Sr flux was monitored using a quartz crystal microbalance (QCM).

EXAMPLES

Two source ports designed with different geometry were used; the standard port (STD) (i.e., port 201 in FIG. 2), which is typical for most MBE systems and the extended port (ETD) (i.e., long collimator embodiment 221 in FIG. 2) which is 21 cm longer than the standard port. One of the standard ports was modified for differential pumping using a port aperture (PA), mounted in front of the source, and connected to a turbo pump on the side of the source port, as illustrated by port 211 in FIG. 2. The purpose of this differential pumping is to minimize the oxygen partial pressure near the source by mechanically pumping it through the turbo pump, as discussed in detail, vide infra. The port aperture, having an inner diameter of 1.5 cm and a thickness of 3 mm, is designed for easy insertion/removal using a few screws. A gate valve (not shown) is inserted between the source port and the turbo pump to enable or disable differential pumping. In addition, an ion-gauge (not shown) is mounted on the source port to read the gas pressure near the source. In the extended port geometry, a custom-fabricated collimator (inner diameter=1.5 cm, and length=19 cm) is mounted in front of the source. We investigated flux stability against oxygen-rich conditions for all of these port geometries, and surprisingly discovered that the presently disclosed configuration is the most effective configuration for minimizing source oxidation issues.

Figure 3:
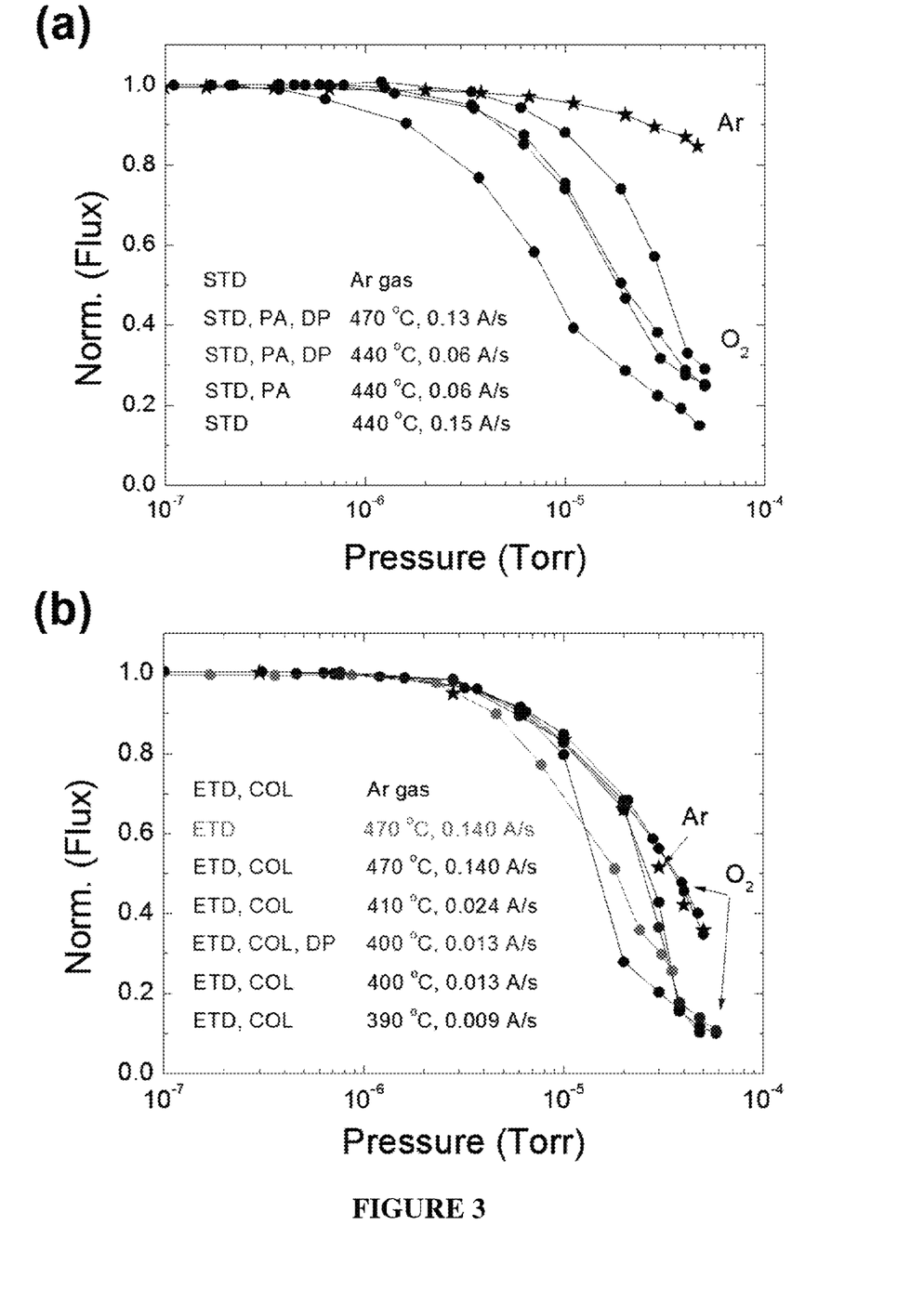
FIG. 3 illustrates an example of short-term flux stability for (a) standard port with/without port aperture (PA) and differential pumping (DP) and (b) extended port with/without collimator (COL) and differential pumping (DP) at various flux rates.

Short-term flux stability for the standard port and the extended port with various geometrical configurations, as discussed above, is shown in FIG. 3. Measurements were performed in both oxygen and argon environments because the measured flux signals are affected not only by the source oxidation but also by the scattering effect of the gas. From the flux scattering measurements conducted in the argon environment, it was found that the source scattering was dominated by the source-to-substrate distance (standard port=21 cm, extended port=42 cm) and not affected by other parameters such as flux rate, port aperture, collimator or differential pumping. This scattering process can be well-described by the Beer-Lambert law. Introducing oxygen gas into the chamber resulted in serious source oxidation in the standard port configuration and the flux decreased significantly at higher oxygen pressures. (See graph (a) of FIG. 3.) After mounting a port aperture (PA) in front of the source, it was observed that the flux rate dropped from 0.15 to 0.06 Å/sec. Even at this low flux rate, an enhancement in the short term flux stability was observed. Using differential pumping through the turbo pump, connected to the back end of the source port, provided almost no additional improvement. In order to achieve similar flux rates to give a better comparison with the standard port, the source temperature was increased. It was observed that even though a significant improvement in flux stability was achieved at lower oxygen pressures, the problem still existed as the oxygen pressure was increased beyond $3\times10^{-6}$ Torr. The short-term flux stability for the extended port with/without collimator and differential pumping is shown in graph (b) of FIG. 3. At a similar flux rate, the extended port resulted in a comparable trend to that of a standard port with port aperture and the differential pumping. When the collimator was added to the extended port it was observed that the source remained free from source oxidation issues even at an oxygen pressure as high as $5\times10^{-5}$ Torr. The short-term flux stability in this configuration was limited by the scattering of flux at higher pressures in a confined space along the collimator length, as seen by the measurements in the Ar environment. At an $O_2$ pressure of approximately $1\times10^{-5}$ Torr, the flux was seen to be fairly stable, with flux rates as low as 0.01 Å/sec, which is considerably lower than the typical growth rate in an MBE process.

Figure 4:
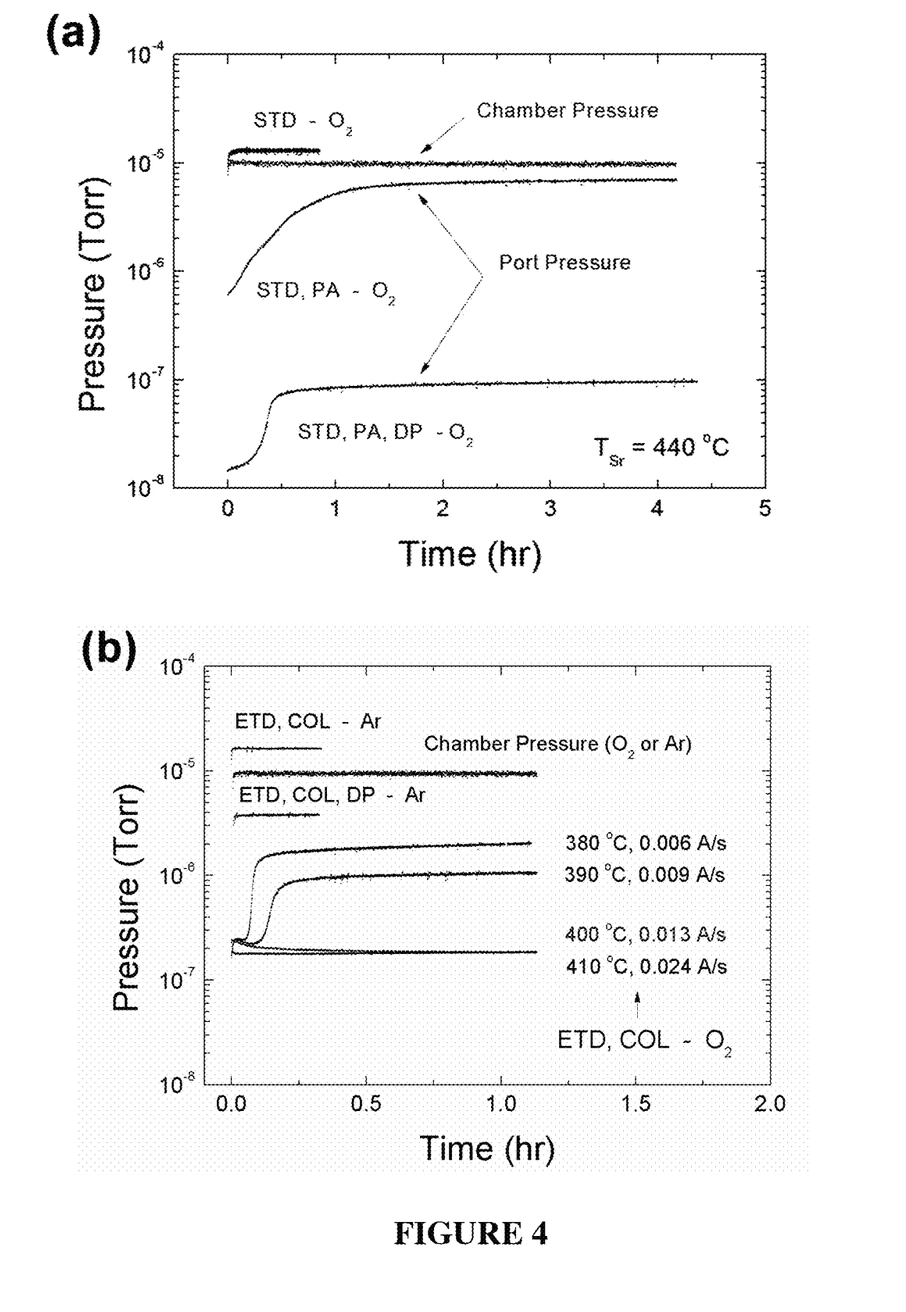
FIG. 4 illustrates an example of time dependence of oxygen pressure near a Sr source at (a) standard port and (b) extended port with various geometrical configurations when the oxygen partial pressure in main chamber is kept $1\times10^{-5}$ Torr. Long term flux stability of (c) standard port and (d) extended port.

To investigate long-term flux stabilities, we monitored both Sr flux and oxygen partial pressure in the source port for several hours, keeping oxygen pressure in the main chamber to be $1\times10^{-5}$ Torr. In a standard port without PA and DP, on introducing oxygen into the growth chamber, the oxygen pressure inside the source port increased suddenly; resulting in an abrupt drop in the flux rate, followed by a continuous drop in the flux rate. A port aperture on the source port lowered the oxygen conductivity and the $O_2$ partial pressure in the source port increased slowly to its equilibrium value. A similar trend is observed for the drop in the flux rate. See FIG. 4(a, c). It took approximately 30 minutes for $O_2$ partial pressure and the flux rate to reach an equilibrium state with differential pumping at the source port, and approximately 1.5 hours to reach equilibrium without differential pumping. See FIG. 4(a, c). Beyond this, the oxygen pressure still increased without reaching a saturation point, causing the flux to decrease continuously. Considering that our goal was to make the flux drift less than 1% over several hours of growth, this long time delay to reach the equilibrium state, as well as the continuous decrease of flux are not desirable. This result implies that even if the oxygen molecules in the source port were pumped out mechanically through the turbo pump, the oxygen partial pressure near the source would not be low enough to prevent the source oxidation problem.

On the contrary, in the extended port with collimator, good long-term flux stabilities were observed, even without mechanical pumping. Oxygen pressure near the source quickly saturated within minutes to an equilibrium value even at very low flux rate approximately 0.013 Å/sec, which is approximately 10 times lower than the typical growth rate. See FIG. 4(b, d). The flux had to be extremely low (below 0.009 Å/sec) to observe source oxidation, which occurred on a much reduced scale compared to a standard port with port aperture and differential pumping.

Figure 5:
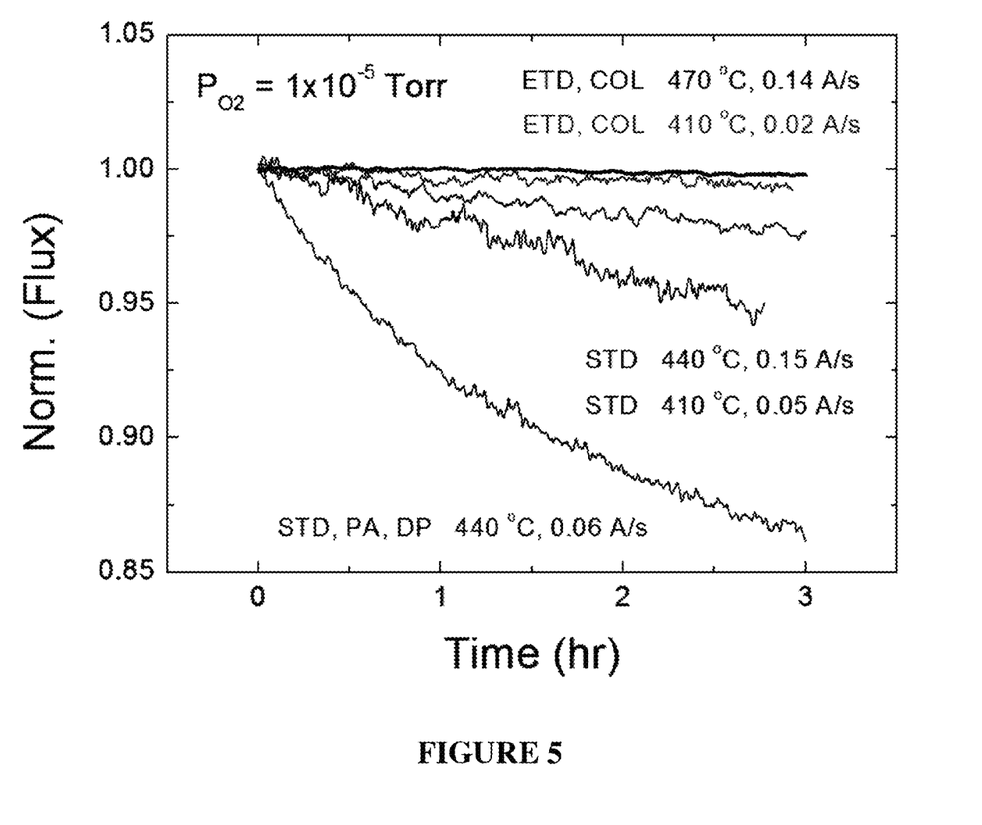
FIG. 5 illustrates an example of normalized long-term flux stability for the extended port with collimator and the standard port with/without port aperture, differential pumping.

Although not wishing to be bound by any particular theory, it is believed that this powerful enhancement in flux stability for a collimator-mounted extended port can be explained as follows. Once the source is heated, the source atoms are deposited continuously on the wall of the collimator. Because of the long length and the large surface area of the collimator, most of the oxygen species coming into the source port stick to the collimator wall, due to chemical reaction with Sr (forming strontium oxide), without reaching the source itself. This gettering effect reduces the effective oxygen conductance through the collimator by a factor of a thousand compared to its geometric conductance for our chosen geometry (inner diameter=1.5 cm, and length=19 cm); resulting in an effective oxygen partial pressure near the source well below that required for source oxidation, and stabilizing the source flux over a long period of time, even at high oxygen pressures in the growth chamber. As shown in FIG. 5, the flux drift was negligible, less than 1%, for the three-hour typical operating time for an oxide-MBE process. In the extended port with collimator, the flux variation over three hours is less 1% even if the flux rate is much slower than typical growth rate while that of standard port is more than 2% even with higher growth rate. The standard port with a port aperture and differential pump (and DP shows the worst performance; over three hours, flux drops by more than 10%, indicating that even improper differential pumping is worse than having none.

A self-gettering pump scheme has been designed, and one embodiment of the pump scheme has been constructed and evaluated in the context of the source oxidation problem in the complex-oxide MBE process. The self-gettering pump may use the Sr source itself as the oxygen pumping medium and reduces the effective oxygen conductance through the collimator by a factor of a thousand compared to its geometric conductance. As a result, the oxygen partial pressure near the source may be easily maintained well below that which produces source oxidation even when the growth chamber is in a harsh oxidation environment, and the source flux remains as stable as that of an ultra-high-vacuum environment. Moreover, the pump has a self-feedback mechanism that allows a stronger pumping effectiveness for more easily oxidizing elements, which is a desirable property for eliminating the source oxidation problem. We are able to achieve a stable Sr flux even when the flux is much lower than the typical growth rate, under an oxygen pressure of $1\times10^{-5}$ Torr.

We have provided one embodiment using a collimator with an inner diameter of 1.5 cm and a length of 19 cm, designed for uniform deposition over small samples (approximately 1 cm×1 cm). A trade-off would be required between achieving this high level of source stability and deposition uniformity over large samples and the exact dimensions of the collimator would have to be optimized. However, for a collimator of the appropriate dimensions, minimal coating was observed on the collimator wall even after more than 100 hrs of operation, further demonstrating its effectiveness. This self-gettering pump scheme has been demonstrated with a Sr source, but it should work in a similar way for other easily oxidized elements. The self-gettering pump of the invention provides a powerful solution to the source oxidation problem in an oxide-MBE system. Thus, in addition to covering embodiments wherein the length of the collimator is greater than its inner diameter, the embodiments include options where the length is at least 4 times greater than the inner diameter, at least 6 times greater than the inner diameter, between 2 and 7 times greater than the inner diameter, at least 8 times greater than the inner diameter, at least 10 times greater than the inner diameter, at least 12 times greater than the inner diameter, up to 15 times greater than the inner diameter, up to 20 times greater than the inner diameter, up to 25 times greater than the inner diameter, or any combinations of these limits.

Although specific embodiments of the present invention have been described above, and the following claims, such disclosure is not intended to limit the invention in any way. As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

What is claimed is:

1. A self-gettering differential pump for a molecular beam epitaxy system, comprising:
   a collimator having a length greater than its diameter, wherein the ratio between the length and the diameter is about two to seven, wherein the collimator includes a first end and a second end, and wherein the first end is positioned in proximity to the vacuum chamber opening; and
   a port positioned in proximity to the second end of the collimator, the port comprising an effusion cell that, when activated, delivers a reactant through the collimator to the vacuum chamber opening, wherein the reactant comprised on or more of Sr, Mg, Ca, Ba, Ti and Zn;
   wherein the reactant also serves as an oxygen gettering agent on the inner sidewall of the collimator.

2. The self-gettering differential pump of claim 1, wherein the reactant is a multi-element source.

3. The self-gettering differential pump of claim 1, wherein the reactant comprises strontium.

4. A molecular beam epitaxy system, comprising:
   a vacuum chamber having an opening; and
   a self-gettering differential pump that is in fluid communication with the opening, the pump comprising:
      a collimator having a length greater than its diameter, the collimator comprising, a first end and a second end, wherein the ratio between the length and the diameter is about two to seven, and wherein the first end is positioned in proximity to the opening; and
   a port positioned in proximity to the second end of the collimator, the port comprising an effusion cell that, when activated, delivers a reactant through the collimator to the opening, wherein the reactant comprises one or more of Sr, Mg, Ca, Ba, Ti and Zn;
      wherein the reactant also serves as an oxygen gettering agent on the inner sidewall of the collimator.

5. The system of claim 4, wherein the reactant is a multi-element source.

6. The system of claim 4, wherein the reactant comprises strontium.

7. The system of claim 4, wherein a ratio of length to diameter of the collimator is greater than 10.

8. The system of claim 4, wherein a ratio of length to diameter of the collimator is from about 2 to about 7.

9. A method of reducing flux instability in a molecular beam epitaxy system, comprising:
   operating a self-gettering differential pump that is in fluid communication with an opening of a vacuum chamber, wherein the pump comprises:
      a collimator having a length greater than its diameter, the collimator comprising a first end and a second end, wherein the ratio between the length and the diameter is about two to seven, and wherein the first end is positioned in proximity to the opening, and a port positioned in proximity to the second end of the collimator, the port comprising an effusion cell that, when activated, delivers a reactant through the collimator opening, wherein the reactant comprises one or more of Sr, Mg, Ca, Ba, Ti and Zn;
      wherein the reactant also serves as an oxygen gettering agent on the inner sidewall of the collimator.

* * * * *